(12) United States Patent
Nishikawa

(10) Patent No.: US 7,864,337 B2
(45) Date of Patent: Jan. 4, 2011

(54) POSITIONING APPARATUS, EXPOSURE APPARATUS, AND DEVICE MANUFACTURING METHOD

(75) Inventor: Tadayasu Nishikawa, Oyama (JP)

(73) Assignee: Canon Kabushiki Kaisha (JP)

( * ) Notice: Subject to any disclaimer, the term of this patent is extended or adjusted under 35 U.S.C. 154(b) by 168 days.

(21) Appl. No.: 12/182,433

(22) Filed: Jul. 30, 2008

(65) Prior Publication Data

US 2009/0040528 A1 Feb. 12, 2009

(30) Foreign Application Priority Data

Aug. 6, 2007 (JP) ............................. 2007-204573

(51) Int. Cl.
*G01B 11/02* (2006.01)
(52) U.S. Cl. ..................................... 356/500
(58) Field of Classification Search .................. 356/500
See application file for complete search history.

(56) References Cited

U.S. PATENT DOCUMENTS 6,819,433 B2 11/2004 Takai et al.
6,864,963 B2 * 3/2005 Chen et al. ..................... 355/75
7,016,049 B2 * 3/2006 Kurosawa ..................... 356/508
7,292,348 B2 11/2007 Akimoto

FOREIGN PATENT DOCUMENTS

JP 2002-319541 A 10/2002
JP 2006-120699 A 5/2006

* cited by examiner

*Primary Examiner*—Tarifur Chowdhury
*Assistant Examiner*—Jonathon D Cook
(74) *Attorney, Agent, or Firm*—Rossi Kimms & McDowell LLP

(57) ABSTRACT

A positioning apparatus comprises a first measuring device measuring a position of the stage in a first measuring range, a second measuring device measuring a position of the stage in a second measuring range having an overlapping range overlapping the first measuring range, a third measuring device measuring a position of the stage in the overlapping range, and a controller controlling the first measuring device to take over the measurement value obtained by the second measuring device in the overlapping range in moving the stage from the second measuring range to the first measuring range, thereby switching from measurement by the second measuring device to measurement by the first measuring device. The controller performs correction processing based on the measurement by the third measuring device so as to reduce an error of the measurement value obtained by the first measuring device after the switching.

14 Claims, 4 Drawing Sheets

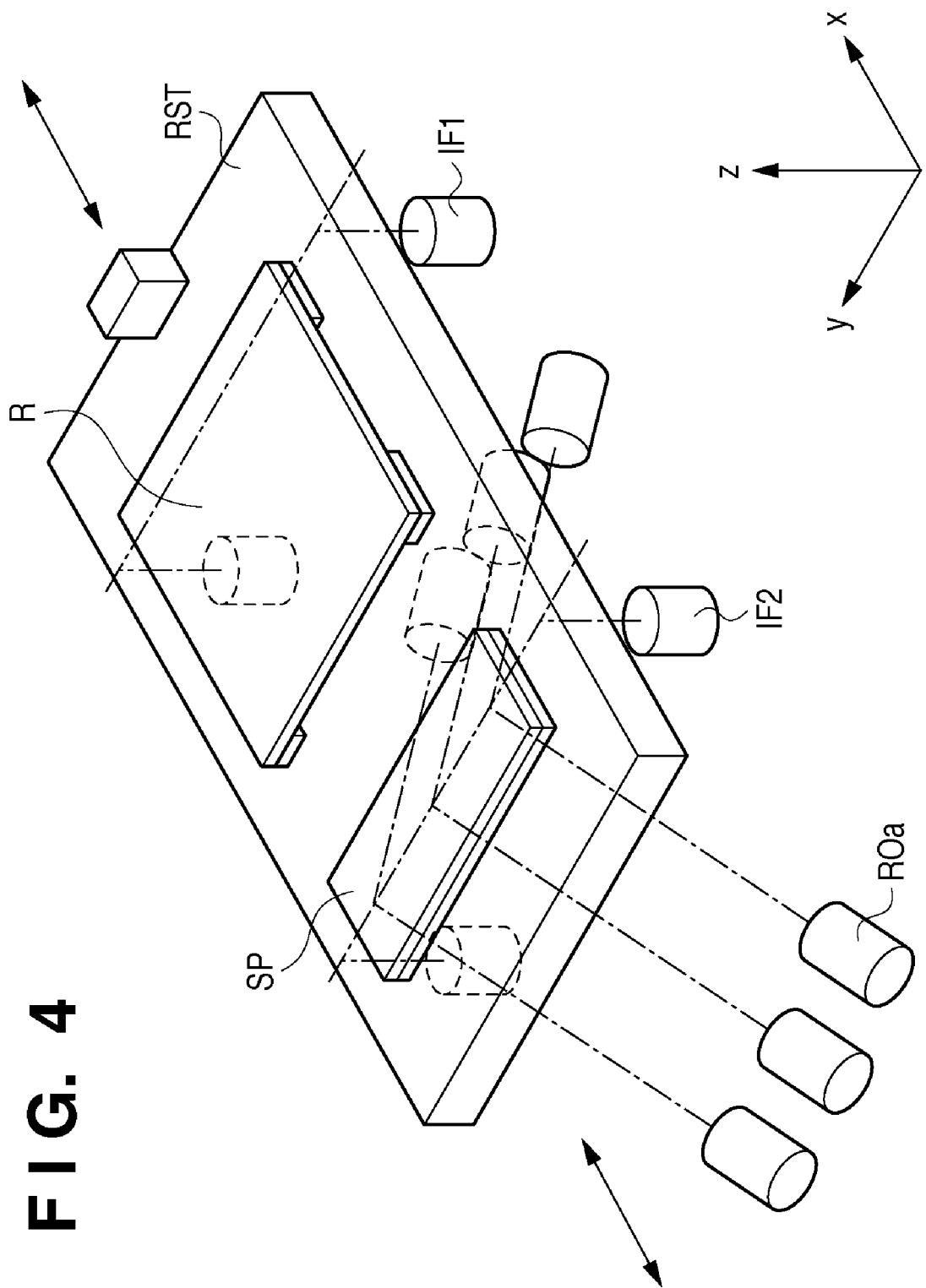

POSITIONING APPARATUS, EXPOSURE APPARATUS, AND DEVICE MANUFACTURING METHOD

BACKGROUND OF THE INVENTION

1. Field of the Invention

The present invention relates to a positioning apparatus which positions a stage, an exposure apparatus having the positioning apparatus, and a device manufacturing method using the exposure apparatus.

2. Description of the Related Art

An exposure apparatus which transfers the pattern of an original onto a photosensitive agent applied on a substrate is employed to manufacture a device such as a semiconductor device, liquid crystal display device, or thin-film magnetic head by photolithography.

Nowadays, to obtain a higher resolving power, the numerical aperture of a projection optical system is increasing. Along with an increase in the numerical aperture of the projection optical system, the depth of focus of the projection optical system is decreasing. It is therefore becoming important to improve the focus accuracy.

Under the circumstances, the exposure apparatus is provided with an auto focus mechanism which measures the surface position of a substrate (the position of the projection optical system in the optical axis direction) by an oblique-incidence position measuring device, and focuses the substrate surface onto the image plane position of the projection optical system.

Also, an imaging error due to deformation of the original is becoming non-negligible. To cope with this situation, an oblique-incidence position detection system measures the shape of the original pattern surface while the original is held by the original stage. Based on the measurement result, the amount of change in imaging plane position is calculated. The imaging characteristic of the projection optical system, or the focus position of the substrate or original is controlled so that this change amount is corrected.

The exposure apparatus generally uses a laser interferometer and reflecting mirror to measure the position of a stage. Japanese Patent Laid-Open No. 2002-319541 discloses an arrangement in which a laser interferometer is used to measure the position of a stage. In the position measurement using a laser interferometer, the laser wavelength changes due to slight fluctuations in atmospheric pressure, temperature, and humidity, leading to a measurement error. To solve this problem, the arrangement disclosed in Japanese Patent Laid-Open No. 2002-319541 controls the environment in the exposure apparatus by covering it with a chamber, and corrects fluctuations that remain uncorrected by this control, using the measurement values obtained by a barometer, thermometer, and hygrometer.

Japanese Patent Laid-Open No. 2006-120699 discloses an apparatus which measures the position of a stage using a plurality of laser interferometers. In this arrangement, the used laser interferometers are switched.

To perform position measurement by switching between the used laser interferometers, it is necessary to prevent any shift in measurement value between before and after switching. For this purpose, an overlapping interval in which the plurality of laser interferometers can simultaneously measure the position of a stage must be provided to allow a laser interferometer after switching to take over the measurement value obtained by that before switching.

Correction to reduce a measurement error due to fluctuation in wavelength as described above can be performed assuming the optical path length in resetting a laser interferometer as a base point. An apparatus which does not switch between laser interferometers continuously performs correction unless it stops due to, for example, an error. However, when the laser interferometers are switched, the position information must be set in a laser interferometer after switching for every switching. Because it is difficult to switch between the laser interferometers at exactly the same position, the optical path length serving as the base point of wavelength correction changes upon this switching. Unless this change amount is taken into consideration, it causes a measurement error, resulting in a positional shift.

When a moving stage is controlled in the pitching direction using a laser interferometer (to be referred to as a pitching interferometer hereinafter), the measurement result obtained by the pitching interferometer can have an error due to the influences of the temperature, humidity, and atmospheric pressure. This error changes the orientation of the stage in the pitching direction. In switching from one laser interferometer to another one, position information including an error is set in this other laser interferometer. This can cause an error in the position measurement value of the stage. This error can occur not only due to a change in orientation in the pitching direction but also due to a change in orientation in the yawing direction.

The above-described problem can be posed even when a measuring device which measures a relative position by another scheme in place of laser interferometers is used.

SUMMARY OF THE INVENTION

The present invention has been made in consideration of the above-described problem, and has as its object to reduce a measurement error in an apparatus which, for example, switches between measuring devices.

One aspect of the present invention relates to a positioning apparatus which positions a stage. The positioning apparatus includes a first measuring device which measures the position of the stage in a first measuring range, a second measuring device which measures the position of the stage in a second measuring range having an overlapping range which overlaps the first measuring range, a third measuring device which measures the position of the stage in the overlapping range, and a controller which controls the first measuring device to take over the measurement value obtained by the second measuring device in the overlapping range in moving the stage from the second measuring range to the first measuring range, thereby switching from measurement by the second measuring device to measurement by the first measuring device. The controller performs correction processing based on the measurement value obtained by the third measuring device so as to reduce an error of the measurement value obtained by the first measuring device after the switching from the measurement by the second measuring device to the measurement by the first measuring device.

According to the present invention, it is possible to reduce a measurement error in an apparatus which, for example, switches between measuring devices.

Further features of the present invention will become apparent from the following description of exemplary embodiments with reference to the attached drawings.

BRIEF DESCRIPTION OF THE DRAWINGS

FIG. 4 schematically shows an original stage and devices arranged around it in the second embodiment.

DESCRIPTION OF THE EMBODIMENTS

Embodiments of the present invention will be described in detail below with reference to the accompanying drawings.

First Embodiment

Figure 1:
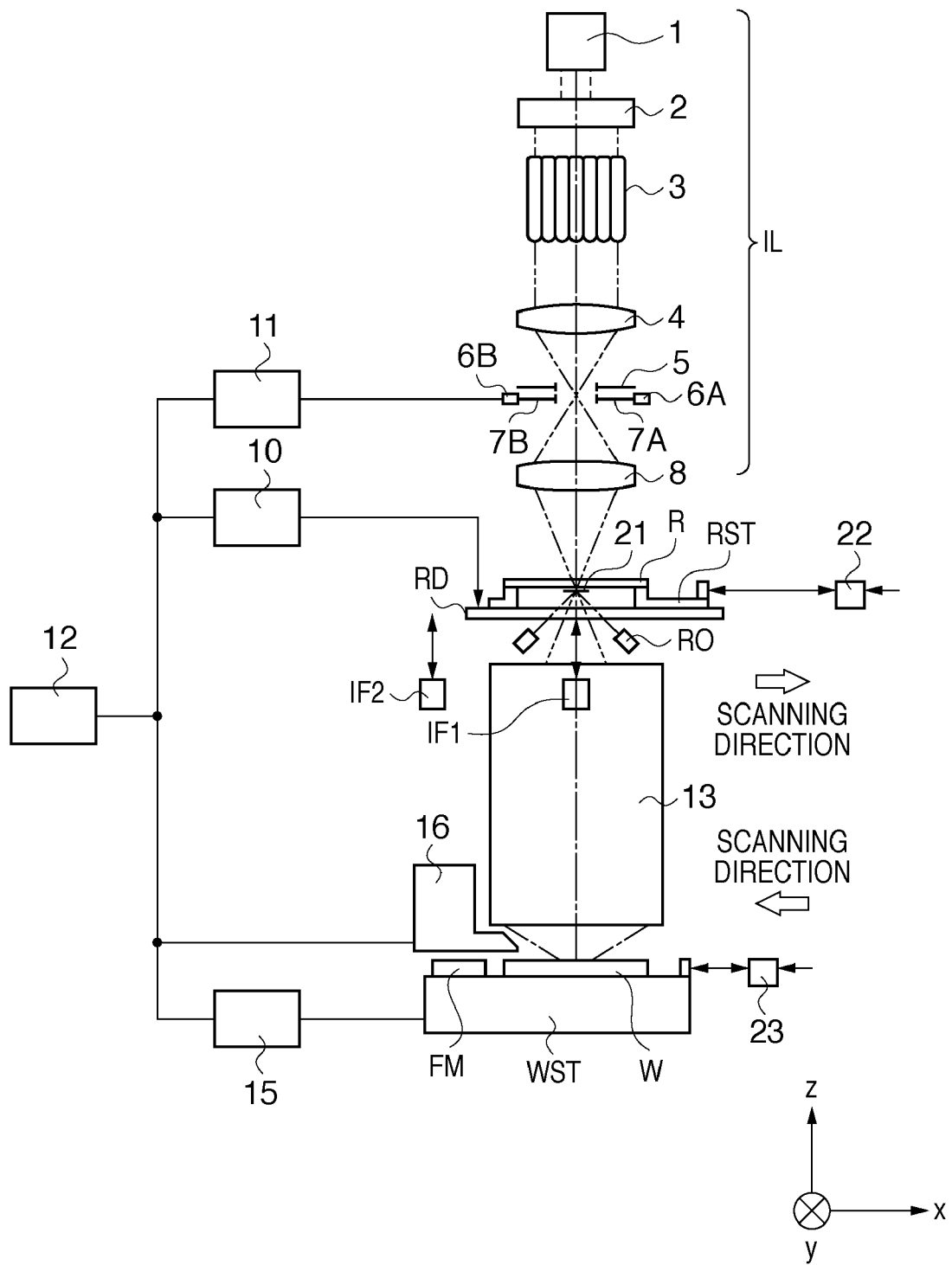
FIG. 1 shows the schematic arrangement of a projection exposure apparatus according to the first embodiment of the present invention.

FIG. 1 shows the schematic arrangement of an exposure apparatus according to the first embodiment of the present invention. This exposure apparatus projects the pattern of an original R onto a substrate W, thereby exposing the substrate W to light. In this embodiment, the exposure apparatus is implemented as a scanning exposure apparatus. The original (reticle) R is illuminated by an illumination optical system IL with light supplied from a light source 1. The illumination optical system IL illuminates a slit-shaped region with a uniform illuminance. The original R is scan-driven while being held by an original stage RST such that its surface is oriented along the x-y plane. The substrate W is scan-driven in synchronism with the original R while being held by a substrate stage WST. With this operation, the pattern of the original R is transferred onto the substrate W via a projection optical system 13.

In a two-dimensional plane perpendicular to the optical axis of the projection optical system 13, a direction (first direction) parallel to the scanning direction (moving direction) of the original R in a slit-shaped illumination region 21 is defined as the +x direction (or −x direction), and a direction parallel to the optical axis of the projection optical system 13 is defined as the z direction (third direction). In addition, a direction perpendicular to the x and z directions is defined as the y direction (second direction).

The light source 1 can be an excimer laser such as an $F_2$ excimer laser, ArF excimer laser, or KrF excimer laser. The light source 1 can also be, for example, a metal vapor laser, YAG laser, or mercury lamp.

If a pulse light source such as a laser is used as the light source 1, exposure can be switched on or off by controlling power supplied from a power supply device for the pulse light source. If a continuous light source such as a mercury lamp is used as the light source 1, exposure can be switched on or off by inserting a shutter into a shaping optical system 2 of the illumination optical system IL, and operating this shutter. Exposure may be switched on or off by opening/closing a movable blind (variable field stop) 7 (to be described later).

The illumination optical system IL can include the shaping optical system 2, a fly-eye lens 3, a condenser lens 4, a field stop 5, the movable blind 7, and a relay lens 8. A light beam emitted by the light source 1 is shaped to have a predetermined diameter by the shaping optical system 2, and enters the fly-eye lens 3. A large number of secondary sources are formed on the exit surface of the fly-eye lens 3. The illumination light from these secondary sources is converged by the condenser lens 4, and reaches the movable blind (variable field stop) 7 through the fixed field stop 5. Although the field stop 5 is set on the side of the condenser lens 4 with respect to the movable blind 7 in FIG. 1, it may be set on the opposite side, that is, on the side of the relay lens 8 with respect to the movable blind 7.

The field stop 5 has a slit-shaped rectangular aperture formed in it. A light beam having passed through the field stop 5 turns into that having a slit-shaped rectangular section, and enters the relay lens 8. The longitudinal direction of the slit is a direction (y direction) perpendicular to the paper surface. The relay lens 8 adjusts the movable blind 7 to be conjugate to the pattern formation surface of the original R. The movable blind 7 includes two blades (light-shielding plates) 7A and 7B which define the dimension of the exposure region in the scanning direction (x direction), and two blades (not shown) which define the dimension of the exposure region in the non-scanning direction (y direction) perpendicular to the scanning direction. The blades 7A and 7B which define the dimension of the exposure region in the scanning direction are respectively supported by driving portions 6A and 6B to be independently movable in the scanning direction. Similarly, the two blades which define the dimension of the exposure region in the non-scanning direction are respectively supported by driving portions (not shown) to be independently drivable in the non-scanning direction. In this embodiment, the illumination light illuminates only the exposure region defined by further limiting the slit-shaped illumination region 21 on the original R, which is set by the fixed field stop 5, by the movable blind 7. The relay lens system 8 is a bilateral telecentric optical system whose telecentricity is maintained in the slit-shaped illumination region 21 on the original R. Driving portions such as the driving portions 6A and 6B are controlled by a variable blind controller 11.

The original R is positioned by a positioning apparatus. The positioning apparatus herein comprises the original stage RST, a driving portion RSD for driving it, and measuring devices (e.g., measuring devices IF1, IF2, and RO) for measuring the position of the original stage RST. The original R is held by the original stage (reticle stage) RST. An original position detector (not shown) is arranged above the original R to detect the position of the original R in the x and y directions. The position of the original stage RST in the x direction (scanning direction) is measured by an interferometer 22. The position of the original stage RST in the z direction (the optical axis direction of the projection optical system 13) is measured by laser interferometers (to be simply referred to as interferometers hereinafter) IF1 and IF2 serving as first and second measuring devices. The pieces of position information of the original stage RST are provided from the interferometers 22, IF1, and IF2 to an original stage controller 10. The original stage controller 10 controls the driving portion RSD of the original stage RST based on the pieces of position information.

A surface position measuring device RO serving as a third measuring device is inserted between the original stage RST and the projection optical system 13. The measurement result obtained by the surface position measuring device RO is provided to a main controller 12 and the original stage controller 10. The pattern surface of the original R must be positioned on the object plane of the projection optical system 13 with high accuracy. This positioning requires detecting the position of the pattern surface of the original R with high accuracy. The surface position measuring device RO does not directly detect the position of the pattern surface of the original R, but detects the surface position of a reference mark SP formed on the original stage RST. The position of the pattern surface of the original R is detected using the surface position measuring device RO and interferometers IF1 and IF2.

The substrate (wafer) W is conveyed onto the substrate stage (wafer stage) WST by a substrate conveyance device (not shown), and held by the substrate stage WST. A substrate stage driving portion (not shown) controls the linear movement of the substrate stage WST in the x, y, and z directions and its rotation about the x-, y-, and z-axes.

A reference mark FM is formed on the substrate stage WST. The reference mark FM can include, for example, a mark for measuring the base line, and that for aligning the original. The position of the substrate stage WST is measured by an interferometer 23, and the measurement result is provided to a substrate stage controller 15. An off-axis alignment sensor 16 is arranged above the substrate W. The off-axis alignment sensor 16 detects an alignment mark formed on the substrate W, and the detection result is sent to the main controller 12. The main controller 12 controls the positioning operation and scanning operation of the substrate stage WST via the substrate stage controller 15.

A pattern formed on the original R is transferred onto each shot region on the substrate W via the projection optical system 13 by the scanning exposure scheme. At this time, in the slit-shaped illumination region 21 set by the field stop 5, the original R is scan-driven in the −x direction (or +x direction) at a velocity VR. Letting $\beta$ be the projection magnification of the projection optical system 13, the substrate W is scan-driven in the +x direction (or −x direction) at a velocity VW (=$\beta \cdot$VR) in synchronism with the scan driving of the original R. With this operation, the pattern of the original R is sequentially transferred onto each shot region of the substrate W.

The surface position measuring device RO obliquely irradiates the pattern surface of the original R as the detection target surface with a light beam, and detects the position where the light beam reflected by the detection target surface enters its detection surface by a position detection element. Based on the detected position information, the surface position measuring device RO detects the position of the detection target surface in the z direction (the optical axis direction of the projection optical system 13).

Figure 2:
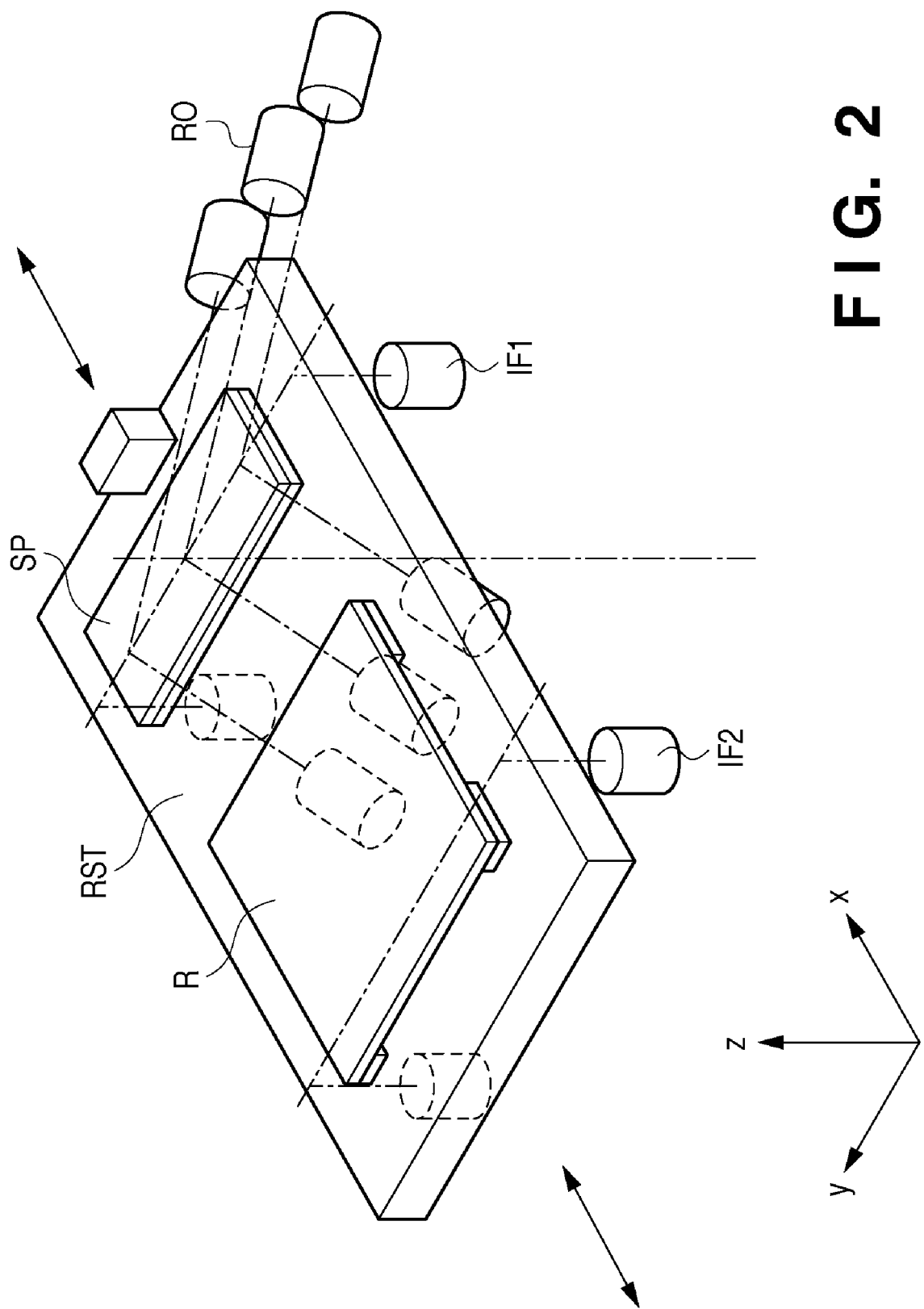
FIG. 2 schematically shows an original stage and devices arranged around it.

FIG. 2 schematically shows the original stage RST and devices arranged around it. The first interferometer (first measuring device) IF1 measures the position of the original stage RST in a first measuring range. The second interferometer (second measuring device) IF2 measures the position of the original stage RST in a second measuring range. The first measuring range and second measuring range have an overlapping range. In other words, the first measuring range and second measuring range overlap each other in the overlapping range. FIG. 2 shows a state in which the original stage RST lies at a position (a position within the overlapping range) to switch an interferometer for measuring the position of the original stage RST in the z direction from the first interferometer (first measuring device) IF1 to the second interferometer (second measuring device) IF2 or vice versa. In this state, both the interferometers IF1 and IF2 can detect the original stage RST.

The position where the surface position measuring device RO performs measurement in the x direction is preferably set near the position where the interferometer IF1 performs measurement in the x direction (the moving direction of the original stage RST). This makes it possible to reduce an Abbe error. The reference mark SP is formed at the position, where the surface position measuring device RO can measure it, on the original stage RST. The reference mark SP has a reflecting surface and measurement mark. The reflecting surface has a region large enough to measure the surface position of the original R while the original stage RST is scan-driven. With this operation, an interferometer for measuring the position of the original stage RST in the z direction can be switched from the interferometer IF1 to the interferometer IF2 or vice versa while scan-driving the original stage RST.

When an interferometer for measuring the position of the original stage RST in the z direction is switched from the interferometer IF1 to the interferometer IF2 or vice versa while the original stage RST stands still, the reflecting surface of the reference mark SP need only have a region large enough for this switching.

Error correction processing in switching between the interferometers IF1 and IF2 will be explained.

Because the interferometers IF1 and IF2 measure the position of the original stage RST relative to a reference position, the position of the original stage RST cannot be detected immediately after powering on the interferometers IF1 and IF2. To detect the position of the original stage RST even in this situation, the interferometer IF1 is reset (the measurement value obtained by the interferometer IF1 is set to, e.g., zero) while the original stage RST is mechanically abutted against a reference member which provides the reference position. Alternatively, the interferometer IF1 may be reset at the timing at which the original stage RST is detected by a sensor such as a photosensor (not shown) which detects the original stage RST as it has moved to a predetermined position. After that, the interferometer IF1 can detect the position of the original stage RST in the z direction as a position relative to the reference position as long as the original stage RST falls within the measuring range of the interferometer IF1.

The surface position measuring device RO further measures the position of the reference mark SP in the z direction, and a resultant measurement value (the position in the z direction) p0 is stored in a storage unit (not shown) of the main controller 12.

Consider a case in which the original stage RST must be largely moved in the x direction to, for example, exchange the original, and it falls outside the measuring range of the interferometer IF1 in the x direction. In this case, the interferometer IF2 is reset in accordance with an instruction from the main controller 12 while the original stage RST falls within the overlapping range which is simultaneously included in the measuring range (first measuring range) of the interferometer IF1 and in the measuring range (second measuring range) of the interferometer IF2.

At this time, the main controller 12 resets the interferometer IF2 by passing the measurement value obtained by the interferometer IF1 to the interferometer IF2. This allows the interferometer IF2 to take over the position information of the original stage RST. When the original stage RST is largely moved in the x direction again to perform, for example, exposure, the main controller 12 resets the interferometer IF1 by passing the measurement value obtained by the interferometer IF2 to the interferometer IF1. This allows the interferometer IF1 to take over the position information of the original stage RST.

Note that the measurement values obtained by the interferometers IF1 and IF2 can include errors due to the influence of, for example, air fluctuation. To avoid this situation, the main controller 12 controls the surface position measuring device RO to measure the surface position of the reference mark SP nearly simultaneously with the reset of the interferometer IF1 by passing the measurement value obtained by the interferometer IF2 to the interferometer IF1 to allow the interferometer IF1 to take over the measurement value obtained by the interferometer IF2.

An amount of correction $\Delta p1$ of the original stage RST is given by:

$$\Delta p1 = p1 - p0$$

where p1 is the value obtained by measuring the reference mark SP by the surface position measuring device RO nearly simultaneously with the reset of the interferometer IF1.

The position of the original stage RST can be corrected when the main controller 12 corrects the target position of the original stage RST or corrects the measurement value obtained by the interferometer IF1 based on the correction amount Δp1. For example, the original stage controller 10 corrects the target position (the actual position as a result) of the original stage RST based on the correction amount Δp1 provided from the main controller 12.

An amount of nth correction Δpn upon a plurality of times of switching is given by:

$$\Delta pn = pn - p0$$

where pn is the measurement value obtained by the surface position measuring device RO upon the nth switching (i.e., the last switching), and p0 is the measurement value obtained by the surface position measuring device RO initially (i.e., in the past). Based on the correction amount Δpn provided from the main controller 12, the original stage controller 10 corrects the target position (the actual position as a result) of the original stage RST.

In the above-described example, the nth correction amount Δpn upon a plurality of times of interferometer switching is calculated as the difference between pn and p0. However, the position of the original stage RST may be corrected by calculating the nth correction amount Δpn as:

$$\Delta pn = pn - p(n-1)$$

where p(n−1) is the value obtained by measuring the reference mark SP for the (n−1)th time.

This correction processing reduces an error of the measurement value obtained by the first interferometer IF1 after switching from measurement by the second interferometer IF2 to measurement by the first interferometer IF1.

Unless the correction as described above is not performed, an error propagates between the interferometers for every interferometer switching. Still worse, such an error accumulates.

As described above, according to the first embodiment, it is possible to attain high-accuracy position measurement by preventing error transmission and error accumulation between the interferometers upon interferometer switching by utilizing the surface position measuring device RO used to measure the surface position of the original R.

Second Embodiment

Figure 3:
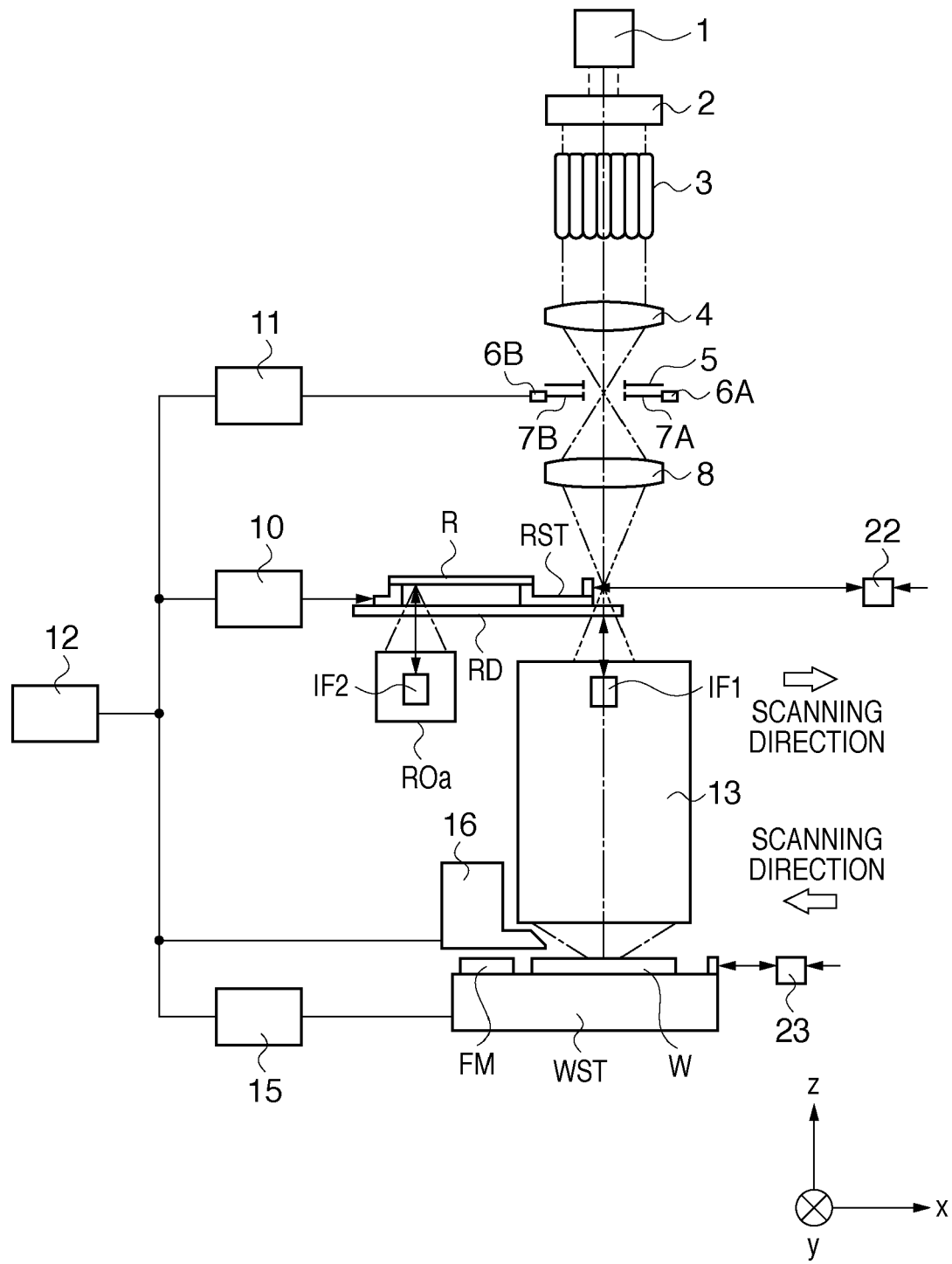
FIG. 3 shows the schematic arrangement of a projection exposure apparatus according to the second embodiment of the present invention.

FIG. 3 shows the schematic arrangement of a projection exposure apparatus according to the second embodiment of the present invention. In the first embodiment, the surface position measuring device RO is accommodated in the space between the original stage RST and the projection optical system 13. In the second embodiment, a surface position measuring device ROa is set to have a measuring range which falls outside a projection optical system 13 and is shifted in the scanning direction with respect to the center of the projection optical system 13. The surface position measuring device ROa is used in place of the surface position measuring device RO according to the first embodiment. Details which are not particularly referred to in the second embodiment can be the same as in the first embodiment.

FIG. 4 schematically shows an original stage RST and devices around it in the second embodiment. FIG. 4 shows a state in which the original stage RST lies at a position (a position within the overlapping range) to switch an interferometer for measuring the position of the original stage RST in the z direction from a first interferometer (first measuring device) IF1 to a second interferometer (second measuring device) IF2 or vice versa. In this state, both the interferometers IF1 and IF2 can measure the position of the original stage RST.

The position where the surface position measuring device ROa performs detection in the x direction is preferably set near the position where the interferometer IF2 performs detection in the x direction. This makes it possible to reduce an Abbe error. A reference mark SP is formed at the position, where the surface position measuring device ROa can detect it, on the original stage RST. The reference mark SP has a reflecting surface and measurement mark. The reflecting surface has a region large enough to measure the surface position of an original R while the original stage RST is scan-driven. With this operation, an interferometer for measuring the position of the original stage RST in the z direction can be switched from the interferometer IF1 to the interferometer IF2 or vice versa while scan-driving the original stage RST.

When an interferometer for measuring the position of the original stage RST in the z direction is switched from the interferometer IF1 to the interferometer IF2 or vice versa while the original stage RST stands still, the reflecting surface of the reference mark SP need only have a region large enough for this switching.

An error correction method used in switching between the interferometers IF1 and IF2 is the same as in the first embodiment.

Other Embodiments

Although the first and second embodiments have exemplified cases in which the present invention is applied to the positioning of an original stage, the present invention is also applicable to the positioning of a substrate stage. In other words, the positioning apparatus according to the present invention is suitable to position at least one of an original and substrate in an exposure apparatus.

The present invention is not particularly limited to positioning in the z direction, and is applicable to positioning in other directions such as the x direction.

In addition to the oblique-incidence detection systems exemplified in the first and second embodiments, the surface position detector may be, for example, a detector of another optical scheme or electrostatic capacitance sensor.

When first and second detection systems having a measurement origin are used in place of the interferometers IF1 and IF2, a temporal change in measurement origin causes an error. Therefore, the first and second detection systems must be calibrated if a difference which falls outside an allowable range occurs between the measurement values obtained by the first and second detection systems and that obtained by the surface position measuring device RO.

The first and second detection systems are calibrated in the following way. For example, the first detection system is calibrated based on the result of transferring the pattern of an original R onto a substrate W, and the second detection system is calibrated next at the switching position using the first detection system as a reference.

The present invention is applicable not only to a scanning exposure apparatus but also to an exposure apparatus (the so-called stepper) which transfers the pattern of an original onto a substrate while the original and substrate stand still.

Application Example

A device (e.g., a semiconductor integrated circuit device or liquid crystal display device) is manufactured by an exposure step of exposing a substrate coated with a photosensitive agent to light using the exposure apparatus according to the above-described embodiment, a development step of developing the photosensitive agent, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-204573, filed Aug. 6, 2007, which is hereby incorporated by reference herein in its entirety.

What is claimed is:

1. A positioning apparatus which positions a stage, comprising:
   a first measuring device configured to measure a position of the stage in a first measuring range;
   a second measuring device configured to measure a position of the stage in a second measuring range having an overlapping range which overlaps the first measuring range;
   a third measuring device configured to measure a position of the stage in the overlapping range; and
   a controller configured to control said first measuring device to take over the measurement value obtained by said second measuring device in the overlapping range in moving the stage from the second measuring range to the first measuring range, thereby switching from measurement by said second measuring device to measurement by said first measuring device,
   wherein said controller performs correction processing based on the measurement value obtained by said third measuring device so as to reduce an error of the measurement value obtained by said first measuring device after the switching from the measurement by said second measuring device to the measurement by said first measuring device, and
   wherein said first and second measuring devices measure the positions of the stage relative to a reference position and said third measuring device measures the position of a reference mark formed on the stage.

2. The apparatus according to claim 1, wherein said controller performs the correction processing based on the measurement value obtained by said third measuring device in the past, and the measurement value obtained by said third measuring device upon the last switching.

3. The apparatus according to claim 2, wherein said controller corrects the measurement value obtained by said first measuring device after switching, on the basis of the measurement value obtained by said third measuring device in the past, and the measurement value obtained by said third measuring device upon the last switching.

4. The apparatus according to claim 1, wherein a position where said third measuring device performs measurement in a moving direction of the stage is set near a position where said first measuring device performs measurement in the moving direction.

5. The apparatus according to claim 1, wherein said controller further controls said second measuring device to take over the measurement value obtained by said first measuring device in the overlapping range in moving the stage from the first measuring range to the second measuring range, thereby switching from measurement by said first measuring device to measurement by said second measuring device.

6. The apparatus according to claim 1, wherein
   the stage is configured to hold an object along a plane defined by a first direction and a second direction perpendicular to the first direction, and is driven in at least the first direction, and
   each of said first measuring device, said second measuring device, and said third measuring device measures a position of the stage in a third direction perpendicular to the first direction and the second direction.

7. The apparatus according to claim 1, wherein said first measuring device and said second measuring device include laser interferometers.

8. A positioning apparatus which positions a stage, comprising:
   a first measuring device configured to measure a position of the stage in a first measuring range;
   a second measuring device configured to measure a position of the stage in a second measuring range having an overlapping range which overlaps the first measuring range;
   a third measuring device configured to measure a position of the stage in the overlapping range; and
   a controller configured to control said first measuring device to take over the measurement value obtained by said second measuring device in the overlapping range in moving the stage from the second measuring range to the first measuring range, thereby switching from measurement by said second measuring device to measurement by said first measuring device,
   wherein said controller performs correction processing based on the measurement value obtained by said third measuring device so as to reduce an error of the measurement value obtained by said first measuring device after the switching from the measurement by said second measuring device to the measurement by said first measuring device,
   wherein said third measuring device includes a measuring device having a measurement origin.

9. The apparatus according to claim 8, wherein said measurement origin includes a reference mark formed on the stage and having a reflecting surface and measurement mark.

10. The apparatus according to claim 9, wherein said reference mark is formed at the position where the third measuring device can measure on the stage.

11. The apparatus according to claim 8, wherein said third measuring device includes an oblique-incidence detection system.

12. An exposure apparatus comprising:
   a mechanism that projects a pattern of an original onto a substrate, thereby exposing the substrate to light; and
   a positioning apparatus configured to position a stage which is at least one of the original and the substrate,
   wherein the position apparatus comprises:
   a first measuring device configured to measure a position of the stage in a first measuring range;
   a second measuring device configured to measure a position of the stage in a second measuring range having an overlapping range which overlaps the first measuring range;
   a third measuring device configured to measure a position of the stage in the overlapping range; and a controller configured to control said first measuring device to take over the measurement value obtained by said second measuring device in the overlapping range in moving the stage from the second measuring range to the first measuring range, thereby switching from measurement by said second measuring device to measurement by said first measuring device, wherein said controller performs correction processing based on the measurement value obtained by said third measuring device so as to reduce an error of the measurement value obtained by said first measuring device after the switching from the measurement by said second measuring device to the measurement by said first measuring device, and wherein said first and second measuring devices measure the positions of the stage relative to a referenced position and said third measuring device measures the position of the reference mark formed on the stage.

13. A device manufacturing method for exposing a substrate to light using an exposing apparatus including a first measuring device configured to measure a position of the stage in a first measuring range; a second measuring device configured to measure a position of the stage in a second measuring range having an overlapping range which overlaps the first measuring range; a third measuring device configured to measure a position of the stage in the overlapping range; and a controller, wherein said first and second measuring devices are for measuring the positions of the stage relative to a reference position and said third measuring device is for measuring the position of a reference mark formed on the stage, the said method comprising the steps of:

controlling said first measuring device to take over the measurement value obtained by said second measuring device in the overlapping range in moving the stage from the second measuring range to the first measuring range, thereby switching from measurement by said second measuring device to measurement by said first measuring device, performing correction processing based on the measurement value obtained by said third measuring device so as to reduce an error of the measurement value obtained by said first measuring device after the switching from the measurement by said second measuring device to the measurement by said first measuring device, and developing the substrate.

14. A positioning apparatus which positions a stage, comprising:

a first measuring device configured to measure a position of the stage in a first measuring range;

a second measuring device configured to measure a position of the stage in a second measuring range having an overlapping range which overlaps the first measuring range;

a third measuring device configured to measure a position of the stage in the overlapping range; and a controller configured to control said first measuring device to take over the measurement value obtained by said second measuring device in the overlapping range in moving the stage from the second measuring range to the first measuring range, thereby switching from measurement by said second measuring device to measurement by said first measuring device, wherein said third measuring device is configured to measure the position of the stage at an initial timing to obtain an initial position value (p0) of the stage and to measure the position of the stage at a timing of switching from the measurement by said second measuring device to the measurement by said first measuring device to obtain a current position value (pn) of the stage, and wherein said controller performs correction processing based on a difference between the initial position value (p0) and the current position value (pn) which are obtained by said third measuring device so as to reduce an error of the measurement value obtained by said first measuring device after the switching from the measurement by said second measuring device to the measurement by said first measuring device.

* * * * *